United States Patent
Lee et al.

(10) Patent No.: US 6,376,392 B1
(45) Date of Patent: Apr. 23, 2002

(54) PECVD PROCESS FOR ULSI ARL

(75) Inventors: Shyh-Dar Lee; Chung-I Chang; Hung-Wen Chiou, all of Hsinchu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/859,362

(22) Filed: May 18, 2001

(51) Int. Cl.⁷ ........................ H01L 21/31; H01L 21/469
(52) U.S. Cl. ........................................ 438/778; 438/786
(58) Field of Search ................................ 438/778, 786, 438/789, 790, 931, 952; 427/589, 255.393

(56) References Cited

U.S. PATENT DOCUMENTS

| | | | |
|---|---|---|---|
| 5,926,740 A | 7/1999 | Forbes et al. | 438/763 |
| 5,968,324 A | 10/1999 | Cheung et al. | 204/192.28 |
| 5,990,002 A | 11/1999 | Niroomand et al. | 438/636 |
| 6,083,852 A | 7/2000 | Cheung et al. | 438/791 |
| 6,159,871 A | * 12/2000 | Loboda et al. | 438/786 |

\* cited by examiner

Primary Examiner—Alexander G. Ghyka
(74) Attorney, Agent, or Firm—George O. Saile; Stephen B. Ackerman

(57) ABSTRACT

A deposition process for silicon oxycarbide films suitable for use as anti-reflection coatings is described. The, process is based on plasma enhanced CVD of silane mixed with methyl-silane, trimethyl-silane, or tetramethyl-silane (together with a carrier gas). Provided the relative gas flow rates are maintained within the ranges specified, films having excellent ARL properties are obtained, with photoresist patterns formed on said films being free of overhangs and footings.

21 Claims, 2 Drawing Sheets

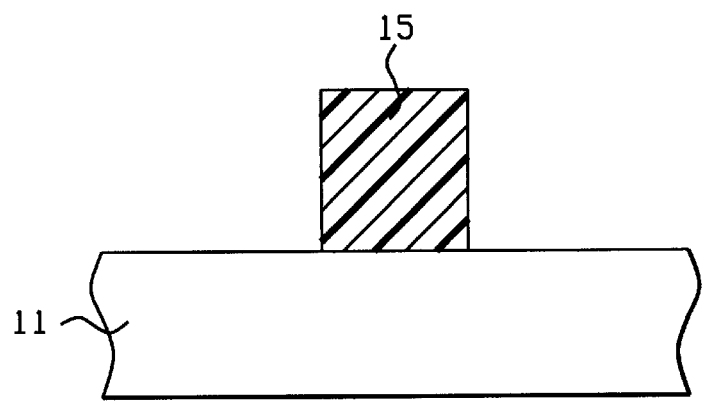
FIG. 1 – Prior Art
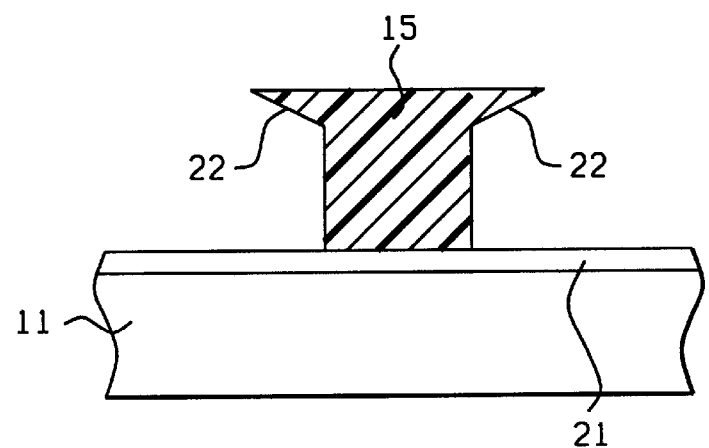
FIG. 2a – Prior Art
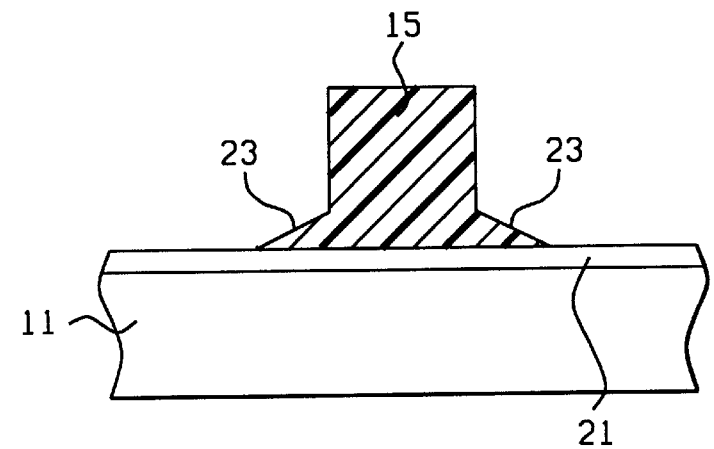
FIG. 2b – Prior Art

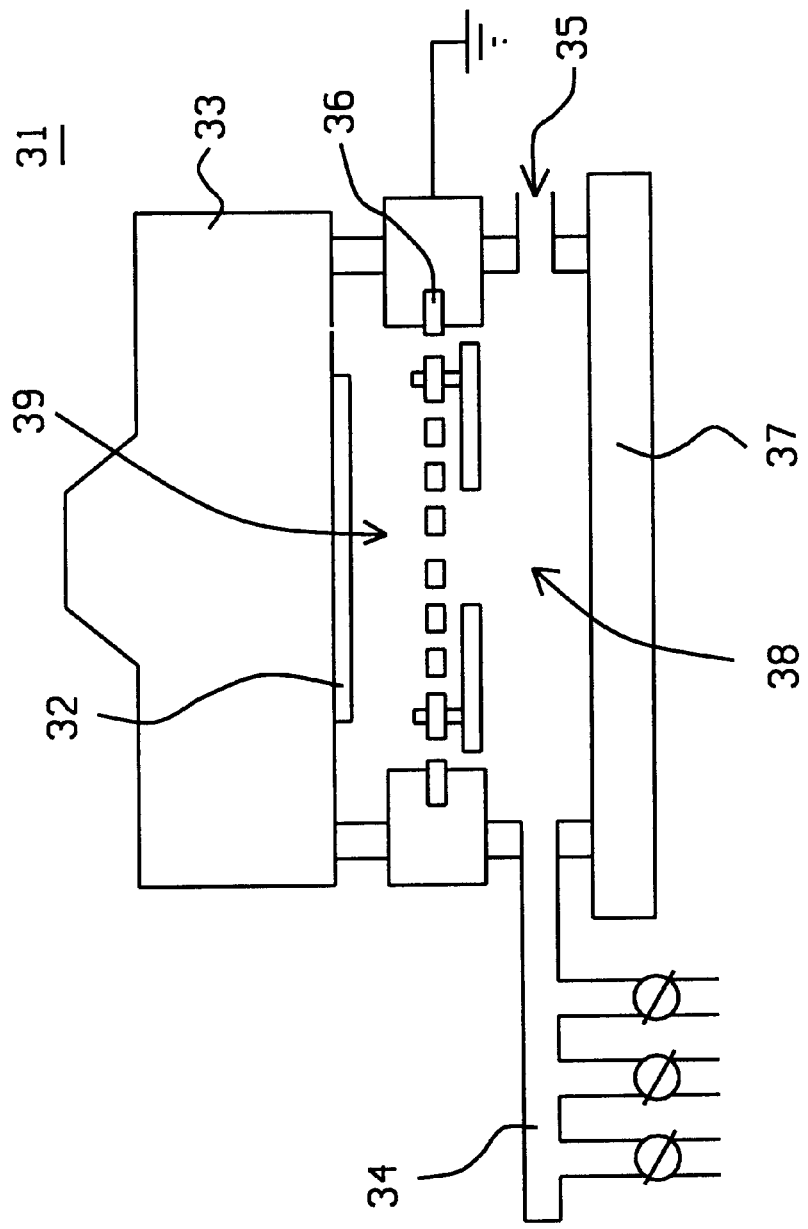
FIG. 3 – Prior Art

PECVD PROCESS FOR ULSI ARL

FIELD OF THE INVENTION

The invention relates to the general field of photolithography with particular reference to formation of ant-reflective coatings for use with deep sub-micron technology.

BACKGROUND OF THE INVENTION

Ant-reflective layers (AFLs) are now widely used at interfaces during photo-lithographic processing of photoresists. Among the problems that may occur if no ARL is present we include reflective notching (associated with variations in surface topography), standing waves that develop as a result of interference between incoming and reflected waves, and back-scattered light in general. These problems are particularly severe in the deep UV (248 nm) range of exposing wavelengths because of difficulties in controlling the critical dimension.

The ARL is laid down over the surface that is to be patterned just prior to the laying down of the photoresist. ARL materials may be either organic or inorganic. Organic ARLs, such as pigments, have the advantage of being easy to deposit uniformly and, additionally, have good planarization, making for a constant photo-resist thickness above them. They do, however, also have the significant disadvantage of having a fixed refractive index and extinction coefficient as well as poor thickness control. This means that their optical thickness cannot be adjusted for maximum effectiveness relative to a given layer of photoresist. They may also be difficult to remove after photoresist stripping.

The optical characteristics of inorganic ARLs are subject to easy control and they can be readily removed using standard etch processes. On the other hand, they have a conformal topography so the thickness of the photoresist relative to the ARL will not be constant.

In weighing the conflicting properties of these two types of ARL, the inorganic variety have been our first choice because they can be deposited through CVD (chemical vapor deposition) which is a mature technology. Their refractive index n and extinction coefficient k can be tailored to be optimum after the lithography details have been determined through simulation. Silicon oxynitride has been among the most popular of the inorganic ARLs because it is easy to deposit by CVD, specifically plasma enhanced (PE) CVD, and its precise composition can be adjusted to obtain the desired n and k values The oxynitride based ARLs do, however, suffer from a problem of their own: A line formed on substrate 11 in photoresist through standard photolithographic processing should have the profile shown as 15 in FIG. 1. When, however, ARL 21 of the SiON type is inserted between the resist and the substrate, the photoresist line profile may develop a footing 23, as shown in FIG. 2b, or an overhang 22, as shown in FIG. 2a. This comes about because of the presence of amino groups in the ARL. Diffusion of acid towards the substrate can result in the formation of a footing while acid evaporation from the resist's top skin (during post-exposure delay) can result in the formation of an overhang.

The present invention teaches how these problems may be avoided by using an inorganic ARL that is free of nitrogen. The method for preparing the ARL is less subject to contamination than processes that are currently described in the prior art.

A routine search of the prior art was performed. The following references of interest were found:

In U.S. Pat. No. 5,968,324, Cheung et al. disclose an ARL made using silane and $N_2O$ while Cheung et al. (U.S. Pat. No. 6,083,852) show an ARL comprised of Si, N and, optionally, O. In U.S. Pat. No. 5,990,002, Niroomand et al. disclose another ARL process in which alternating layers of polysilicon and silicon nitride are used.

Forbes et al., (U.S. Pat. No. 5,926,740) show formation of ARLs that include silicon oxycarbide (SiOC). For example, a substrate is heated to a temperature of approximately 250 degrees Celsius. Silane ($SiH_4$) and methane ($CH_4$) gases are introduced in the presence of an RF (13.56 MHz) plasma at a power between 10 Watts and 100 Watts. No oxygen is present so only silicon carbide gets formed. According to another aspect of this invention, a second layer that includes SiOC is formed. The SiOC second layer is formed by high temperature pyrolysis of silicone polymer resins such as methyl trichlorosilane or dimethyl dichlorosilane. Use of these precursor materials does, however, introduces the possibility of the SiOC being contaminated by chloride ions.

SUMMARY OF THE INVENTION

It has been an object of the present invention to provide a process for forming an anti-reflective layer.

Another object of the invention has been that said anti-reflective layer not bring about the formation of footings or overhangs in photoresist patterns formed over it.

A further object has been that said layer be free of chlorine contaminants.

These objects have been achieved by means of a deposition process for silicon oxycarbide films based on plasma enhanced CVD of silane mixed with methyl-silane, trimethyl-silane, or tetramethyl-silane (together with a carrier gas). Provided the relative gas flow rates are maintained within the ranges disclosed in the present invention, films having excellent ARL properties are obtained, with photoresist patterns formed on said films being free of overhangs and footings.

BRIEF DESCRIPTION OF THE DRAWINGS

FIG. 1 shows the profile of a photoresist line in the absence of an ARL.

FIG. 2a illustrates an overhang that may form if the resist lies on an ARL.

FIG. 2b illustrates a footing that may form if the resist lies on an ARL.

FIG. 3 is a schematic diagram of a system used for PECVD film deposition.

DESCRIPTION OF THE PREFERRED EMBODIMENTS

The present invention describes a process for depositing a layer of silicon oxycarbide (SiOC). Our deposition method of choice has been PECVD. An example of a typical reaction vessel suitable is shown in FIG. 1 but it should be noted that this is intended to illustrate only the general principles involved in PECVD deposition rather than any specific design. The basic elements of PECVD reaction vessel 31 are a lower chamber 38 that is separated from upper chamber 39 by grounded mesh structure 36. Multiple gases, including precursor and carrier gases, are admitted through gas manifold 34, each gas having an individually controllable flow rate. Pumping takes place through exhaust port 35 so that an equilibrium gas pressure is established within the reaction vessel.

Substrate 32 (generally, but not necessarily, silicon) is placed inside upper chamber 39 where it is brought to equilibrium temperature by heater assembly 33. Through application of RF power to lower plate 37, a plasma discharge is initiated and also confined within the lower chamber 38. Reactive ions formed in the plasma are able to diffuse through mesh 36 and enter upper chamber 39 where they decompose, interact, and deposit at the heated surface of substrate 32.

The process of the present invention begins with the provision a reaction vessel (such as 31 in FIG. 3) that is suitable for plasma enhanced chemical vapor deposition. A substrate is placed in the reaction vessel and heated to a temperature between about 250 and 450° C. and a carrier gas is admitted into the vessel at a flow rate between about 2,000 and 7,000 sccm. For the carrier gas we used argon or helium (for which 3,500 sccm was the preferred flow rate), or a mixture of both, in any proportion, (for which 5,000 scam was the preferred flow rate). This was followed by the admission of silane into the vessel at a flow rate between about 1,000 and 2,000 sccm, with 1,250 sccm being preferred.

Then, in a key feature of the invention, methyl-silane is admitted into the vessel at a flow rate between about 200 and 800 sccm (with 475 sccm being preferred) while at the same time pumping from exhaust port 35 so that an equilibrium gas pressure between about 1 and 5 torr is maintained.

An RF discharge is initiated in lower chamber 38 at a power level between about 700 and 1,500 watts and deposition of a layer of silicon oxycarbide above substrate 32 then proceeds at a deposition rate between about 4,000 and 6,000 Angstroms per minute. When the desired thickness of SiOC had been achieved (generally between about 300 and 450 Angstroms), deposition was terminated on the basis of elapsed time of deposition.

The purpose of depositing the above-described layer of SiOC was for it to serve as an ARL. That is, its deposition was then followed by a layer of photoresist. We then confirmed that, with an ARL of this type, lines that were subsequently formed in said layer of photoresist (through lithographic processing) were free of footings and overhangs of the types illustrated in FIGS. 2a and 2b.

Two other embodiments of the invention were also found to result in SiOC ARLs of the quality described above. These embodiments resembled the embodiment described above with the following key differences:

2$^{nd}$ Embodiment

Instead of methyl-silane, trimethyl-silane was used at a flow rate between about 350 and 1,500 sccm, with 900 sccm being preferred.

3$^{rd}$ Embodiment

Instead of methyl-silane, tetramethyl-silane was used at a flow rate between about 500 and 2,000 sccm, with 1,450 sccm being preferred.

While the invention has been particularly shown and described with reference to the preferred embodiments thereof, it will be understood by those skilled in the art that a various changes in form and details may be made without departing from the spirit and scope of the invention.

What is claimed is:

1. A process for manufacturing a layer of silicon oxycarbide, comprising:

providing a reaction vessel suitable for plasma enhanced chemical vapor deposition;

placing a substrate in said vessel and heating the substrate to a temperature between about 250 and 400° C.;

admitting a carrier gas into the vessel at a flow rate between about 2,000 and 7,000 sccm;

admitting silane into the vessel at a flow rate between about 1,000 and 2,000 sccm;

admitting methyl-silane into the vessel at a flow rate between about 200 and 800 sccm;

pumping the contents of the vessel whereby an equilibrium pressure between about 1 and 5 torr is maintained;

initiating an RF discharge within the vessel at a power level between about 750 and 1,500 watts; and thereby depositing said layer of silicon oxycarbide at a deposition rate between about 4,000 and 6,000 Angstroms per minute.

2. The process described in claim 1 wherein the carrier gas is argon.

3. The process described in claim 1 wherein the carrier gas is helium.

4. The process described in claim 1 wherein the carrier gas is a mixture of argon and helium.

5. The process described in claim 1 wherein the substrate is a silicon wafer.

6. The process described in claim 1 further comprising depositing a layer of photoresist on said layer of silicon oxycarbide whereby the layer of silicon oxycarbide serves an anti-reflection layer.

7. The process described in claim 6 wherein lines formed in said layer of photoresist through lithographic processing are free of footings and overhangs.

8. A process for manufacturing a layer of silicon oxycarbide, comprising:

providing a reaction vessel suitable for plasma enhanced chemical vapor deposition;

placing a substrate in said vessel and heating the substrate to a temperature between about 250 and 450° C.;

admitting a carrier gas into the vessel at a flow rate between about 2,000 and 7,000 sccm;

admitting silane into the vessel at a flow rate between about 1,000 and 2,000 sccm;

admitting trimethyl-silane into the vessel at a flow rate between about 350 and 1,500 sccm;

pumping the contents of the vessel whereby an equilibrium pressure between about 1 and 5 torr is maintained;

initiating an RF discharge within the vessel at a power level between about 750 and 1,500 watts; and thereby depositing said layer of silicon oxycarbide at a deposition rate between about 4,000 and 6,000 Angstroms per minute.

9. The process described in claim 8 wherein the carrier gas is argon.

10. The process described in claim 8 wherein the carrier gas is helium.

11. The process described in claim 8 wherein the carrier gas is a mixture of argon and helium.

12. The process described in claim 8 wherein the substrate is a silicon wafer.

13. The process described in claim 8 further comprising depositing a layer of photoresist on said layer of silicon oxycarbide whereby the layer of silicon oxycarbide serves an anti-reflection layer.

14. The process described in claim 13 wherein lines formed in said layer of photoresist through lithographic processing are free of footings and overhangs.

15. A process for manufacturing a layer of silicon oxycarbide, comprising:

providing a reaction vessel suitable for plasma enhanced chemical vapor deposition;

placing a substrate in said vessel and heating the substrate to a temperature between about 250 and 450 degrees C;

admitting a carrier gas into the vessel at a flow rate between about 2,000 and 7,000 scam;

admitting silane into the vessel at a flow rate between about 1,000 and 2,000 sccm;

admitting tetramethyl-silane into the vessel at a flow rate between about 500 and 2,000 sccm;

pumping the contents of the vessel whereby an equilibrium pressure between about 1 and 5 torr is maintained;

initiating an RF discharge within the vessel at a power level between about 750 and 1,500 watts; and thereby depositing said layer of silicon oxycarbide at a deposition rate between about 4,000 and 6,000 Angstroms per minute.

16. The process described in claim 15 wherein the carrier gas is argon.

17. The process described in claim 15 wherein the carrier gas is helium.

18. The process described in claim 15 wherein the carrier gas is a mixture of argon and helium.

19. The process described in claim 15 wherein the substrate is a silicon wafer.

20. The process described in claim 15 further comprising depositing a layer of photoresist on said layer of silicon oxycarbide whereby the layer of silicon oxycarbide serves an anti-reflection layer.

21. The process described in claim 20 wherein lines formed in said layer of photoresist through lithographic processing are free of footings and overhangs.

* * * * *